(12) United States Patent
Dubey et al.

(10) Patent No.: US 8,055,956 B2
(45) Date of Patent: Nov. 8, 2011

(54) BUILT-IN SELF-REPAIRABLE MEMORY

(75) Inventors: Prashant Dubey, Ghaziabad (IN); Amit Kashyap, Uttaranchal (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 338 days.

(21) Appl. No.: 11/474,121

(22) Filed: Jun. 23, 2006

(65) Prior Publication Data

US 2007/0061653 A1    Mar. 15, 2007

(30) Foreign Application Priority Data

Jun. 23, 2005    (IN) .......................... 1637/DEL/2005

(51) Int. Cl.
*G11C 29/00*    (2006.01)

(52) U.S. Cl. ........................ 714/710; 714/718
(58) Field of Classification Search .................. 714/710, 714/711, 718; 365/200, 201
See application file for complete search history.

(56) References Cited

U.S. PATENT DOCUMENTS

| | | | |
|---|---|---|---|
| 6,141,779 A * | 10/2000 | Hill et al. ...................... | 714/710 |
| 6,408,401 B1 * | 6/2002 | Bhavsar et al. .................... | 714/7 |
| 6,662,133 B2 * | 12/2003 | Engel et al. .................... | 702/117 |
| 6,768,694 B2 * | 7/2004 | Anand et al. ............... | 365/225.7 |
| 7,174,486 B2 * | 2/2007 | Adams et al. ................ | 714/710 |
| 7,330,383 B2 * | 2/2008 | Takai ............................. | 365/200 |
| 2002/0075733 A1 * | 6/2002 | Zheng et al. .................. | 365/200 |
| 2004/0153900 A1 * | 8/2004 | Adams et al. ................. | 714/710 |
| 2005/0047253 A1 * | 3/2005 | Puri et al. ................... | 365/225.7 |
| 2006/0161803 A1 * | 7/2006 | Andreev et al. ................... | 714/5 |
| 2007/0104000 A1 * | 5/2007 | Lin et al. ....................... | 365/200 |

* cited by examiner

*Primary Examiner* — Jeffrey A Gaffin
*Assistant Examiner* — Daniel McMahon

(57) ABSTRACT

The present invention provides a built-in self-repairable memory. The invention repairs a faulty IC through hard fuses, as well as through available redundancy in memories on chip. As the faults are not present in all the memories, the invention uses a lesser number of fuses to actually make a repair and thus results in a yield enhancement. The fuse data is stored in a compressed form and then decompressed as a restore happens at the power on. The fuse data interface with the memory to be repaired is serial. The serial links decreases the routing congestion and hence gain in area as well as gain in yield (due to lesser defects and reduced area).

20 Claims, 4 Drawing Sheets

BUILT-IN SELF-REPAIRABLE MEMORY

TECHNICAL FIELD OF THE INVENTION

The instant invention relates to a built-in self-repairable memory.

BACKGROUND OF THE INVENTION

The memories are becoming a major part of any Application Specific Integrated Chip ("ASIC") today. In fact, it is predicted that in coming years the memories will occupy ninety percent (90%) of the total chip area. Therefore, the performance of any ASIC will mostly be dependent upon performance of memories. Since memories cannot test themselves, they are tested either using Built In Self Test (BIST) or any other external circuitry. Redundancy is provided in the memories in the form of extra rows or columns so that the memories can be repaired if they are faulty.

In the present scenario, fuses are implemented on a chip with small/medium size memories, and the same number of fuses is allocated as the number of redundant bits required for all memories. The BIST runs to first calculate the faulty locations and makes a decision whether the faults can be repaired depending upon the available redundancy in the memory or on the chip. In case the memory is not repairable, the BIST declares the memory as dead. After the first BIST run on memory the following configurations can arise.

| CONFIGURATIONS | BBAD | REPAIRABLE | Repair Status |
|---|---|---|---|
| Memory is DEAD | '1' | '0' | "0" |
| Memory is GOOD | '0' | '0' | "0" |
| Memory is BAD but repairable | '1' | '1' | "1" |
| Memory is repaired | '0' | '1' | "0" |

Faulty Memory Repairable Bitmap (FMRB) consists of the faulty address (to be replaced by a available redundancy) and repair status. The repair status is '1' when the memory is to be repaired and 0 if the memory is good. The calculated FMRB present in the BIST is shifted out to the fuse through a shift register. The FMRB shift register of all the BISTs are connected in big single chain, which is further connected to the fuse box as well as to the chip output port. The above shifted data is stored in the fuse and after the memory is repaired the BIST is run again to approve that.

But since only a very small number of the cuts are faulty on the same die, it is not an economical solution to have the fuse bits for all memories on chip, as it leads to an increase in area as a greater number of fuse macros are required on the chip. In order to overcome the above drawback, the concept of fuse sharing is used. In this methodology, the data is stored in the fuse with very few fuses actually present on the chip. The concept of fuse sharing has been shown in FIG. 1. The number of fuses used are "k" while "M" cuts with redundancy are present on the chip, which as total FMRB length of "N" bits. The "k" bit fuse data is converted into the data form the "M" cuts present on memory or N bits. In reality only "M" memories are failing with the total FMRB length less than "k" bits. The k bit fuse data can be divided into the following main parts:

1. Header: single bit data giving the repair status, the number "m".
2. Address data (Kad): the address information relating to m faulty memories out of M memories.
3. Repair data (Krd): the repair data bit stream of "m" repairable and faulty memories.

But to store the data in k fuses the FMRB length of each memory should be known to the central controller, which will store the information in the "k" fuses. This information can be stored in the chip in a hard Read Only Memory (ROM), or a soft ROM. This information can also be sent along with the repair data, but then it will take more time to shift in the data. The die will be repairable if the value of k is greater than or equal to the summation of the value of header data, address data and repair data.

The advantages the above approach offers are reduced fuse area, reduced yield loss due to increased area, less time required for programming the fuse and reduced efforts at the user end. Yet it has a lot of drawbacks, as the problem of routing congestion is not addressed. Yield loss due to metal routing for M cuts is still present and the k to N converter requires a lot of area. An extra ROM is used which increases the overhead in terms of area and testing time.

To reduce routing congestion the fuse data can be serially shifted out as shown in the FIG. 2. The serial shifting improves the yield as a lot of parallel bus routing is reduced. Also yield loss due to parallel bus routing is reduced. But serial loading of fuse data for M cuts takes a lot of clock cycles at power on. The ROM utilized to store the repair data length increases overhead in terms of area and bits to be tested through dedicated BIST. Further extra area overhead in Test Manager Design (not yet included) is required with complex finite state machines (FSM) for encoding and decoding.

The present invention aims at solving problems created due to the above mentioned disadvantages. The ROM is completely eliminated in the present invention due to which extra overhead in terms of area is reduced as well as state machines for fuse encoding and decoding have become simpler. The repair data compression before storing it in the fuse had also been proposed so that more memories can be repaired with the same number of fuses in case die yield goes down.

SUMMARY OF THE INVENTION

To address the above-discussed deficiencies of the prior art, a primary object of the instant invention is to reduce overhead in terms of area and reduce routing congestion.

Another object of the invention is to use fewer fuses and maintain the repair coverage.

Yet another object of the invention is to shift the data for the faulty memories only after loading the same in the memory or the BIST via a serializer.

A further object of the invention is to save the power on time.

To achieve the aforesaid objects the instant invention provides a built-in self-repairable memory comprising:

an array of fuses shared between repairable memory blocks;

a repairable memory block status logic for storing the status of each memory block;

mapping means connected to said array and said logic for providing the mapping data pattern; and computation means for detecting the repairability of said memory;

thereby avoiding the need to store the repair data length of each memory to be repaired.

The data pattern is loaded in the memory using a serial interface thereby reducing routing congestion and defect probability in the repair circuitry.

The built-in self-repairable memory further comprises an encoding and decoding FSM for computing said repair data length.

The data pattern is compressed before being stored in fuses facilitating repair of a larger number of memory blocks.

The repairable memory blocks are repaired at power on by decompressing means that decompresses the compressed data pattern stored in fuses.

The data pattern is a faulty memory repairable bitmap.

A method for repairing memory comprising the steps of:
sharing an array of fuses between repairable memory;
storing the status of each memory block;
providing the mapping data pattern; and
detecting the repairability of the memory;
thereby avoiding the need to store the repair data length of each memory to be repaired.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the term "controller" may be used interchangeably and mean any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The present invention will be described with reference to and as illustrated by the accompanying drawings, in which like reference numerals represent like parts, and in which.

DETAILED DESCRIPTION

FIGS. 3 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged built in self-repairable memory.

Figure 1:
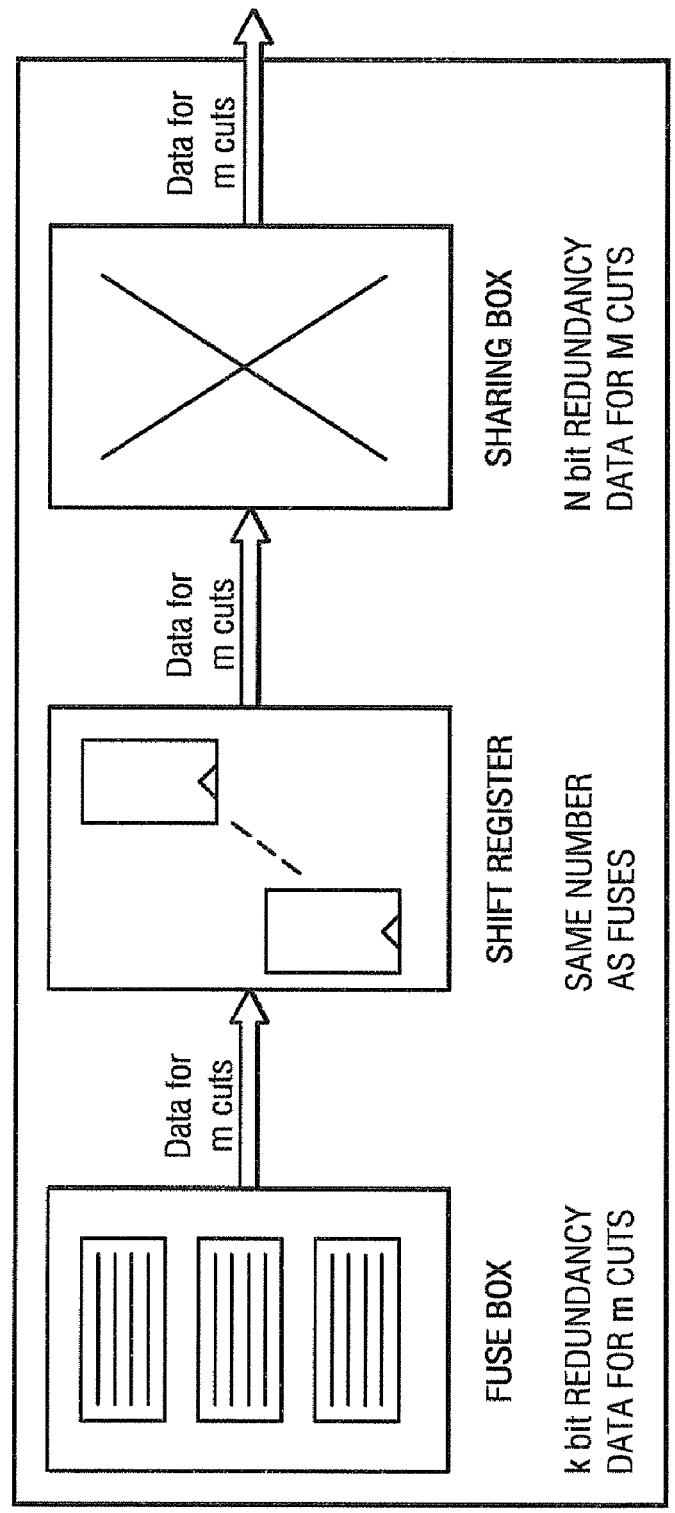
FIG. 1 shows fuse macro block with fuse sharing.
Figure 2:
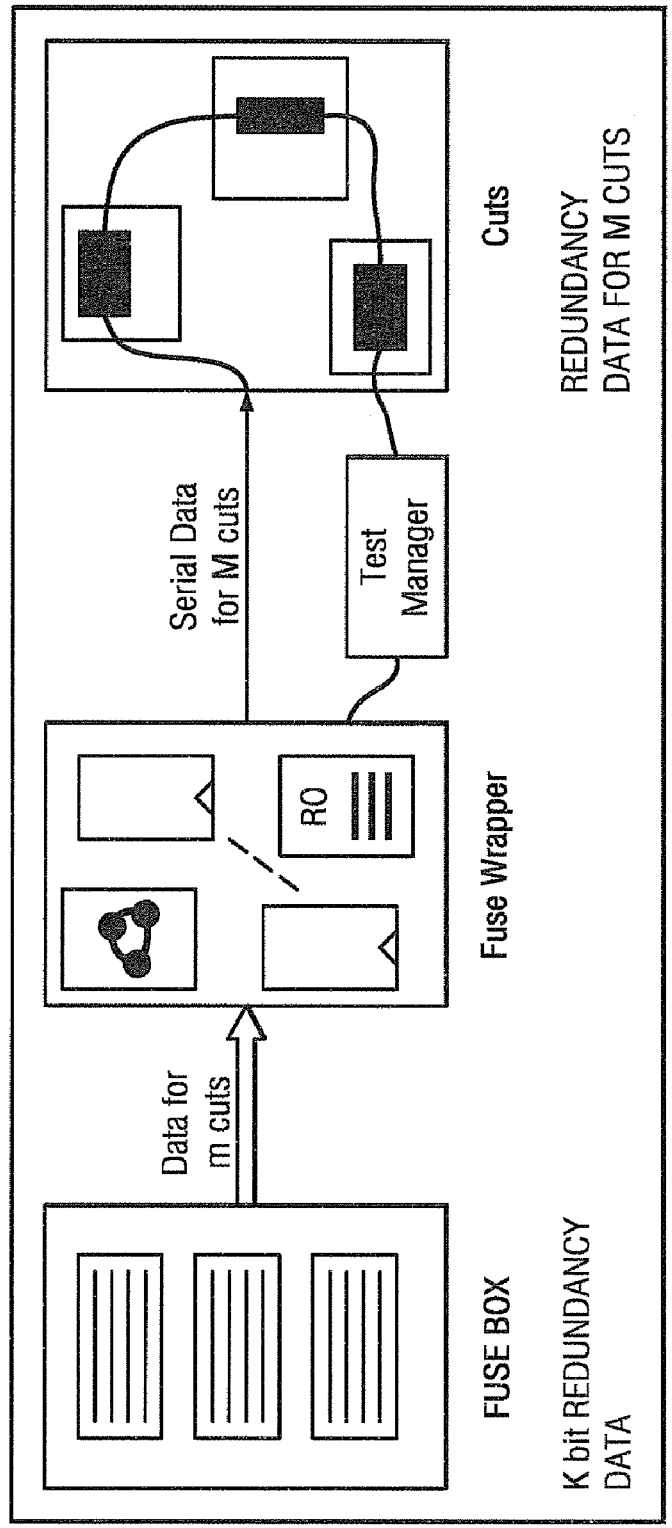
FIG. 2 shows serial loading of fuse data for reducing routing congestion.
Figure 3:
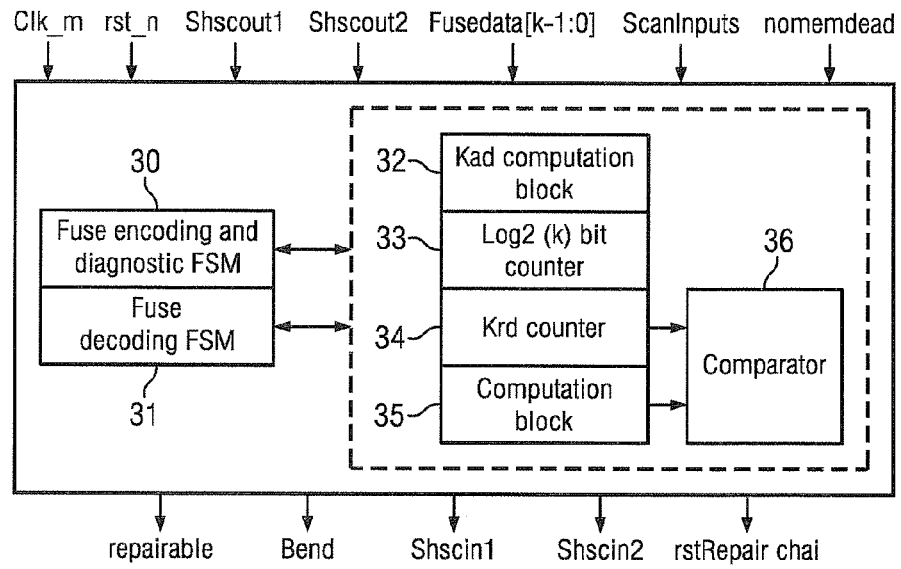
FIG. 3 shows an exemplary block diagram in accordance with the invention.

FIG. 3 shows the architecture of the instant invention consisting of a fuse encoding and diagnostic FSM 30, fuse decoding FSM 31, Kad computation block 32, Log 2 k bit counter 33, Krd counter 34, Computation block 35 and comparator 36 along with the input and output signals.

Fuse encoding and diagnostic FSM 30 is the control unit for the following functions:
Shift out the repairable status of each memory on a die and store Kad in the fuse.

Shift out the repair data of m repairable memories to the remaining bits of the fuse.

Computation of Krd.

Computation of the repair status of the die depending upon the condition of whether k>Kd+Krd+Header, for repairability.

Fuse decoding FSM 31 is triggered depending upon the repair status of the die and performs the following functions:
Shifts out the repair status of all memories on the die from k bit fuse.

Then shifts out the Krd data stored in the k bit fuse for the m repairable memories on the die using Krd counter.

Kad computation block 32 computes the value of Kad depending upon whether the address of m repairable memories is stored or whether the sequence of 1 and 0 where position of 1 specifies a repairable memory is stored.

Log 2 k bit counter 33 is connected to Kad computation block 32 that counts till CountMax (k) until the fuse is completely filled with Kad and Krd. A Krd counter 34 is connected to Log 2 k bit counter 33 that determines Krd length. The computation block 35 in turn computes k−Kad−1.

Figure 4:
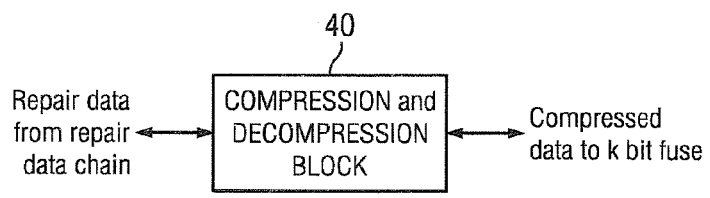
FIG. 4 shows compression and decompression block.
Figure 5:
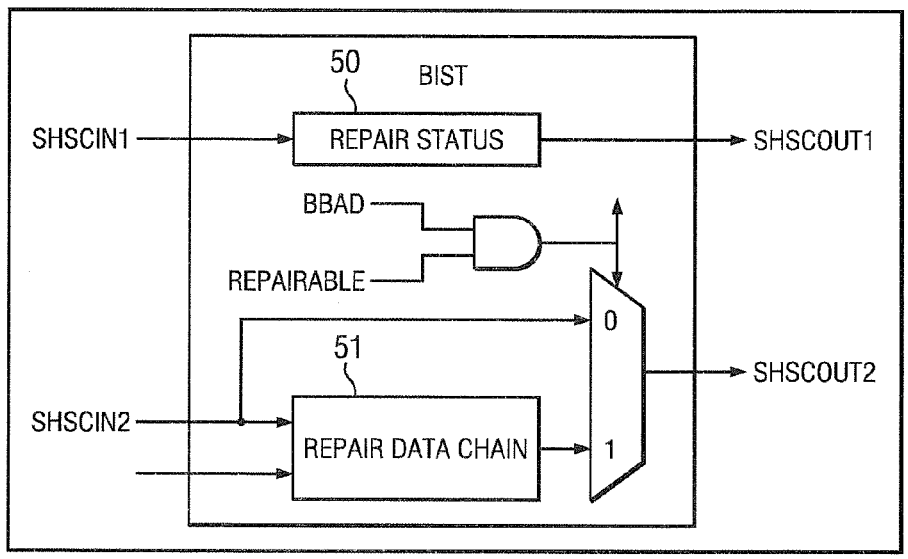
FIG. 5 shows an exemplary block diagram of the invention.

The Krd counter 34 and the computation block 35 are connected to a comparator 36 which is used to determine the die repair status:

FIG. 4 shows a compression/decompression block 40. The repair data coming from the repair data chain of m repairable memories may be long enough and occupy a large space in the k bit fuse. Therefore this repair data is subjected to compression using compression/decompression block 40 before storing it in the k bit fuse. This increases the probability of more memories to be repaired on die data which otherwise could not have been repaired if Krd was stored without compression.

The input pins are
1. clk_m: is the system clock
2. rst_n: reset
3. shscout1: The chain 1 output to the above block conveying repair status
4. shscout2: The REPAIR DATA chain output to the above block conveying repair data bit stream.
5. Fusedata [k−1:0]: The data from fuse at power on.
6. Scan inputs: scan inputs like test_si, test_se, test_so.
7. Nomemdead: The test manager flag to convey that no memory is dead.

The Output Pins are
1. repairable: Bit indicating the repair status of the die.
2. rstRepair_chain: to reset the repair data in BIST chain. To calculate the data in the Krd chain, the chain is first reset. After that '1' is shifted in the chain to calculate after how many cycles it reaches back to initial data. This clock count is the number of repair data in the chain.
3. bend: The pin goes high when all the operations are completed.
4. shscin1: serial input to BIST to give repair status.
5. shscin2: serial input to BIST to give the repair data bit stream.

The FMRB from the m repairable memories is drawn out in serial fashion and stored in the k bit fuse. There are two separate chains for repair status and repair data. The complete configuration has been shown in FIG. 5.

The shift register 50 receives all the repair status bits and outputs CHAIN1. The shift register 51 receives the repair data of the entire BIST and outputs the second chain CHAIN2. The calculated FMRB present in the BIST is shifted out to the fuse in the following way:
Repair status is serially shifted out through SHSCOUT1 pin.
Repair data is serially shifted out through SHSCOUT2 pin.

Figure 6:
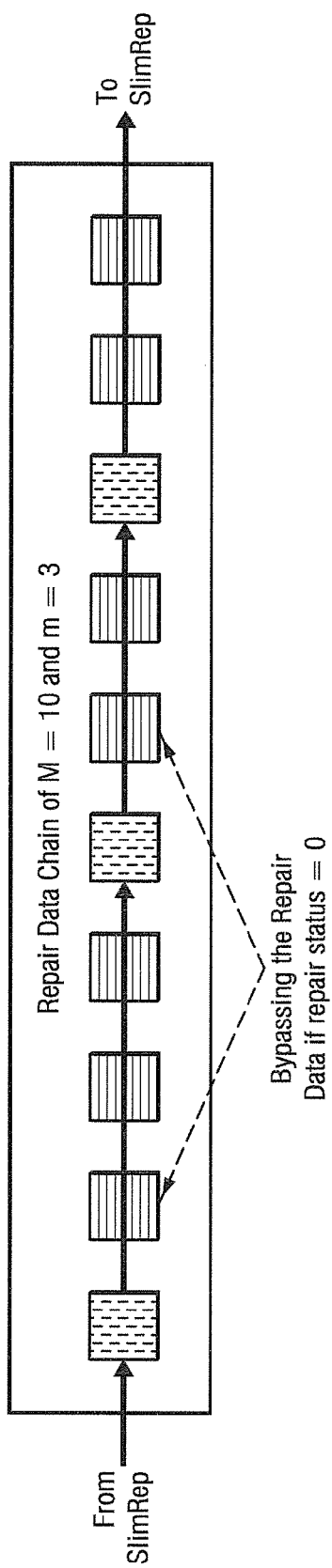
FIG. 6 shows ten memories on a die as an example.
Figure 7:
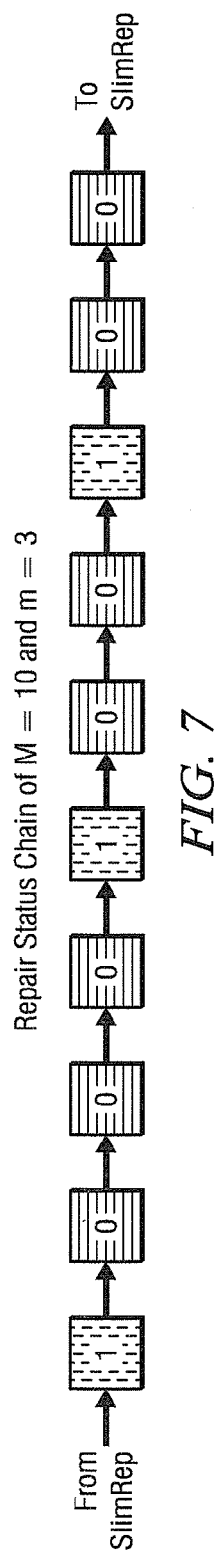
FIG. 7 shows the serially shifted out repair status data.

FIG. 6 shows ten memories on a die as an example. The repair status of each memory is drawn out first. If the memory is good, the repair status is set to '0'. If the repair status bit is '1', the memory is repairable. The repairable status is shifted out serially by running counter 10(M) times. In this case the serially shifted out repair status data is "0010010001" as shown in FIG. 7.

The repair data chain is shortened by bypassing the repair data chain of good memories. Thus the repair data of only m repairable faulty memories out of total M memories is shifted out, hence requiring lesser number of clock cycles.

The instant invention uses a "k" bit register, which exactly represents the "k" bit fuse. Any data present in these registers is programmed in the fuses. These "k" registers are divided into three parts:
1. Header: single bit data giving the die repair status, the number "m".
2. Address data (Kad): the address information relating to m faulty members out of M memories.
3. Repair data (Krd): the repair data bit stream of "m" faulty memories.

All the three values mentioned above are calculated as well as the information whether the die is still repairable with the "k" fuses. To determine this first the value of Kad is calculated. Then Krd is counted. Based upon the values of Kad as well as Krd, it is checked whether the die is repairable or not.

Determination of address data (Kad) length:
Repair status of each memory is shifted out first and there is "1" detector in the controller. There are two ways to store Kad:
 1. The clock count on which the output SHSCOUT1 is "1" is stored as the address of the faulty memory.
 2. The repair status sequence itself can be stored.
Depending upon which method is chosen, Kad length can be determined accordingly.

Determination of repair data (Krd) length:
The Kad is shifted back to the corresponding memories. The repair status bit of each memory bypasses the good memory repair data from the CHAIN2.
 1. The repair data present in the serially connected REPAIR DATA chain of BIST of m repairable memories is shifted out and stored in the remaining bits of k bit fuse.
 2. After the fuse is filled the serially connected REPAIR DATA chain is resetted.
 3. Scan the bit '1' through the REPAIR DATA chain to determine the length of Krd.

Determination of Repair Status of a Die:
Upon the determination of length of Kad and Krd, the repair status of a die can be known, since for repairability of the die k>=kad+krd+Header.

To conclude, the solution that is provided by the invention is worth using on a die with a large number of memories with redundancy. Since all memories on the die will not be faulty, therefore providing fuse for all of them will not be an efficient technique. So fuse can be shared. Also the serial shifting of repair status and repair data to and from BIST will reduce the routing congestion. Compression technique used on the repair data before storing it in fuse will enable the repair of more memories if yield goes down. There is also reduction in area and power on settling time by using this concept. Efforts at the user end are also drastically reduced.

LEGENDS k Number of fuses present on the dice
M Number of redundant memories on chip
m Number of bad but repairable memories on chip
N Sum of all redundancy bits per memory
Kad Address data for the repairable memories (m) on chip
Krd Repair status data of all the memories (M) on chip
Rdw Repair data length in worst case
Rdb Repair data length in the best case It is intended that the present invention encompass such changes and modifications as fall within the scope of the appended claims.

What is claimed is:

1. A built-in self-repairable memory comprising:
    an array of fuses shared between repairable memory blocks;
    repairable memory block status logic that operates to store a status of each memory block, wherein within the repairable memory block status logic, m bits are used to indicate a status of m memories, and wherein the repairable memory block status logic partitions the m bits from m repair addresses of the m memories;
    a mapping controller connected to said array of fuses and said repairable memory block status logic that provides a mapping data pattern relating to a faulty memory repairable bitmap comprising a repair status chain and repair data chain, wherein the length of the repair data chain is shorted by bypassing the repair data chain of good memories; and
    a computation controller that detects the reparability of said built-in self repairable memory.

2. The built-in self-repairable memory as claimed in claim 1 wherein said data pattern is loaded in said memory using a serial interface thereby reducing routing congestion and defect probability in the repair circuitry.

3. The built-in self-repairable memory as claimed in claim 1 further comprising an encoding and decoding finite state machine for computing said repair data length.

4. The built-in self-repairable memory as claimed in claim 1 wherein said data pattern is compressed before being stored in fuses facilitating repair of a larger number of memory blocks.

5. The built-in self-repairable memory as claimed in claim 1 wherein said repairable memory blocks are repaired at power on by a decompressing controller that decompresses the compressed data pattern stored in fuses.

6. The built-in self-repairable memory as claimed in claim 1 wherein said data pattern is a compressed faulty memory repairable bitmap.

7. A method for repairing memory comprising the steps of:
    sharing an array of fuses between repairable memory blocks;
    storing a status of each repairable memory block;
    providing a mapping data pattern comprising a repair status chain and repair data chain, wherein the length of the repair data chain is shorted by bypassing the repair data chain of good memories; and
    detecting a repairability of said each repairable memory block, wherein the status of each repairable memory block and an address of each repairable memory block are partitioned and stored separately.

8. The method for repairing memory as claimed in claim 7 wherein said data pattern is serially loaded in said memory thereby reducing routing congestion and defect probability in the repair circuitry.

9. The method for repairing memory as claimed in claim 7 wherein a compressed data pattern is stored in fuses facilitating repair of a larger number of memory blocks.

10. The method for repairing memory as claimed in claim 7 wherein said repairable memory blocks are repaired at power on by decompressing a compressed data pattern stored in fuses.

11. The method for repairing memory as claimed in claim 7 wherein said data pattern is a faulty memory repairable bitmap.

12. The method for repairing memory as claimed in claim 7 wherein a repair data length is computed using an encoding and decoding finite state machine.

13. A built-in self-repairable memory comprising:
a plurality of repairable memory blocks;
an array of fuses shared between the repairable memory blocks;
a fuse encoding finite state machine;
a fuse decoding finite state machine;
a Kad computation block for computing Kad address data for the repairable memory blocks, wherein the Kad address relates to address information relating to m faulty memories out of M total memories;
a log 2 k bit counter where k is the number of fuses in the array of fuses;
a Krd counter for computing Krd repair status data of all the memory blocks, wherein the Krd repair status data relates to a bit stream of the m faulty memories;
a computation block for computing k minus Kad minus 1; and
a comparator circuit for determining a die repair status, wherein the Kad address data for the m repairable memories and the status data for all the memory blocks are partitioned into two data sets.

14. The built-in self-repairable memory as claimed in claim 13 wherein the fuse encoding finite state machine (1) shifts out a repairable status of each memory block and stores the Kad address data in a fuse, and (2) shifts out repair data of m bad but repairable memory blocks to a remaining portion of the fuse, and (3) computes a Krd repair status of all of the memory blocks, and (4) computes the repair status of a die depending upon whether the value k is greater than or equal to the sum of the Kad address data and the Krd repair status data and a header value.

15. The built-in self-repairable memory as claimed in claim 13 wherein the fuse decoding finite state machine (1) shifts out a repairable status of all memories on a die from a k bit fuse, and (2) then shifts out the Krd repair status data stored in the k bit fuse for the m repairable memories on the die by using the Krd counter.

16. The built-in self-repairable memory as claimed in claim 13 wherein the Kad computation block for computing Kad address data for m repairable memories computes a value of Kad depending upon whether an address of m repairable memories is stored or whether a sequence of one and zero is stored where a position of one specifies a repairable memory.

17. The built-in self-repairable memory as claimed in claim 13 wherein the log 2 k bit counter is connected to the Kad computation block and counts until a fuse is completely filled with Kad data and Krd data.

18. The built-in self-repairable memory as claimed in claim 13 wherein the Krd counter determines a Krd data address length.

19. The built-in self-repairable memory as claimed in claim 13 wherein the computation block for computing the value k minus Kad minus one computes the value k minus Kad minus one from a value of Kad that is provided from the Kad computation block.

20. The built-in self-repairable memory as claimed in claim 13 wherein the comparator circuit for determining a die repair status determines the die repair status by determining whether the value k is greater than or equal to the sum of the Kad address data and the Krd repair status data and a header value.

* * * * *